United States Patent [19]

Hoft et al.

[11] 3,900,799

[45] Aug. 19, 1975

[54] SPLIT PULSE GENERATOR

[75] Inventors: Donald J. Hoft, Holliston; Philip R. Shutt, Harvard, both of Mass.

[73] Assignee: The United States of America as represented by the Secretary of the Air Force, Washington, D.C.

[22] Filed: May 9, 1974

[21] Appl. No.: 468,327

[52] U.S. Cl. ..................... 328/28; 328/30; 328/136

[51] Int. Cl.[2] ..................... H03K 5/00; H03K 5/156; H03K 5/20

[58] Field of Search ............... 328/28, 30, 187, 136; 307/271

[56] References Cited

UNITED STATES PATENTS

| | | | |
|---|---|---|---|
| 2,668,910 | 2/1954 | Starr | 328/28 X |
| 2,764,679 | 9/1956 | Berkowitz | 328/28 |
| 3,249,897 | 5/1966 | Trilling | 307/271 X |
| 3,337,747 | 8/1967 | Krasnick et al. | 307/271 X |
| 3,780,213 | 12/1973 | Harna | 328/63 X |

*Primary Examiner*—Malcolm F. Hubler
*Attorney, Agent, or Firm*—Joseph E. Rusz; George Fine

[57] ABSTRACT

A split pulse generator generates a first half-pulse frequency, $f_1$, which is different from the second half-pulse frequency, $f_2$. The output pulse is continuous throughout the pulse width. Thus during transition time in the center of the pulse, the phase is essentially continuous in progressing from $f_1$ to $f_2$.

2 Claims, 2 Drawing Figures

SPLIT PULSE GENERATOR

BACKGROUND OF THE INVENTION

Some radars, such as the AN/TPN-19 acquisition radar, when operated in the scan mode, must provide a 1 μsec transmitted pulse with unique characteristics. The first half-pulse frequency, $f_1$, must be different from the second half-pulse frequency, $f_2$, by a significant factor to provide the system with intra-pulse frequency diversity. Transmitter power amplification is obtained in a crossed field amplifier (CFA). Since this type of amplifier oscillates at an uncontrolled frequency when RF drive is removed, even for nanoseconds, the pulse delivered to the transmitter must be continuous throughout the pulse width, i.e., no power "suck-out" anywhere during the pulse. This implies that during the transition time in the center of the pulse, that the phase be essentially continuous in progressing from $f_1$ to $f_2$, lest the radar transmit spurious energy. The two half-pulse frequencies should be derived from a crystal controlled source to provide adequate frequency stability for operating in scan mode.

The present invention provides a frequency generator having the above-described unique characteristics. It is noted that the generator may be referred to as a split or contiguous pulse generator.

SUMMARY OF THE INVENTION

There is provided a frequency pulse generator of the frequency shift keying type. There is generated a first half-pulse frequency, $f_1$, which is different from the second half-pulse frequency, $f_2$.

To assure phase continuity throughout the pulse width and from pulse to pulse when switching from one frequency to the other, the subsystem was established such that all frequencies involved, i.e., first and second half-pulse frequencies and the pulse repetition frequency (PRF) as well as the pulse-center timing trigger are derived from the same frequency source (or clock), thus providing coherency between signals. Coherency assures that on a pulse-to-pulse basis, the phase relationships of $f_1$ and $f_2$ will remain constant. A variable phase shifter is utilized in the path of the $f_2$ processing circuits to allow the phase of $f_2$ to be adjusted such that at the transition time the phase of $f_1$ and $f_2$ is continuous.

DETAILED DESCRIPTION OF THE PREFERRED EMBODIMENT

Figure 1:
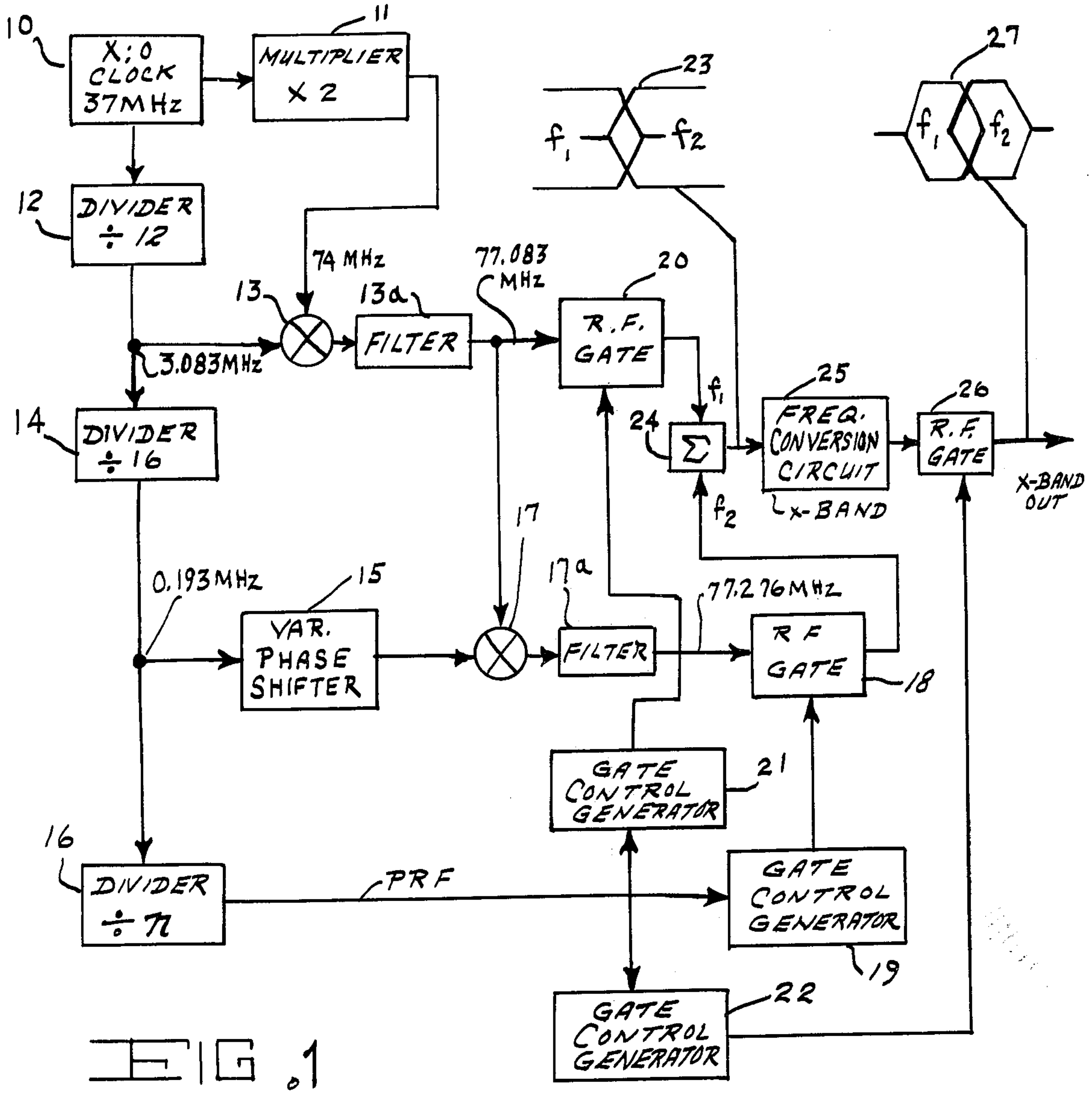
FIG. 1 shows in block diagram form a preferred embodiment of the split pulse generator.

Now referring in detail to FIG. 1, there is shown crystal controlled oscillator which serves as clock 10. The frequency of the output signal from clock 10 is 37 MHz which is simultaneously received by frequency multiplier 11 and frequency divider 12. Component 11 multiplies by 2 and component 12 divides by 12. Mixer 13 receives simultaneously the output signals from frequency multiplier 11 and frequency divider 12, one signal having a frequency of 74 MHz and the other 3.083 MHz, respectively. The output signal with a frequency of 77.083 MHz from mixer 13 is applied to conventional RF gate 20 by way of filter 13*a*.

The output signal from divider 12 is also received by divider 14 which divides the frequency by 16 to provide a signal with a frequency of 0.193 MHz which is simultaneously applied to conventional variable phase shifter 15 and frequency divider 16. Mixer 17 simultaneously receives the output signal of frequency 77.083 MHz from mixer 13 by way of filter 13*a* and the output signal of frequency 0.193 MHz from variable phase shifter 15. It provides an output signal of a frequency of 77.276 MHz by way of filter 17*a* to conventional RF gate 18.

Normally closed conventional RF gates 18 and 20 are open for a preselected length of time in accordance with gate control pulse signals received from gate control pulse generators 19 and 21, respectively. Gate control pulse generators 19 and 21 receive the identical PRF signals from frequency divider 16 which divides by a preselected number, *n*. Gate control pulse generator 21 is so designed to have a 20 μsec output pulse with an extremely short fall time and gate control pulse generator 19 is designed to provide a 20 μsec output pulse with an extremely short rise time. The aforesaid traveling edge and leading edge substantially coincides to provide signal waveform 23 at the output of summation network 24. It is noted that gate control pulse generators 19, 21 and 22 are arranged to provide pulses at a predetermined time with a predetermined width.

Figure 2:
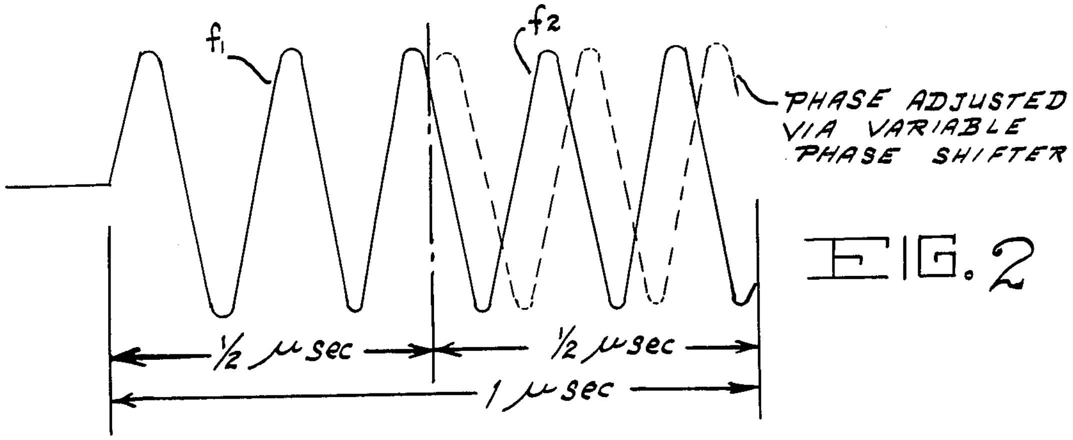
FIG. 2 shows a single pulse output of the split pulse generator.

The output signal from summation network 24 is approximately 40 μ seconds in duration with a transition in the center thereof from frequency $f_1$ to $f_2$. This transitional output signal is applied to conventional frequency conversion circuit 25 to provide X-band operation. The X-band output signal is received by conventional normally closed RF gate 26 which is gated on for a preselected period of time of μsec by a pulse from gate control pulse generator 22 which receives the identical PRF signal as gate control pulse generators 19 and 21. Gate control generator 22 is so designed as to provide a pulse which in time duration is ½ μsec on either side of the frequency transitional point of waveform 27 shown at the X-band output of RF gate 26. A more detailed illustration of the aforesaid output waveform is shown in FIG. 2 wherein the pulse width is 1 μ second.

It is again noted to assure phase continuity throughout the pulse width and from pulse to pulse when switching from one frequency $f_1$ to the other, $f_2$, the system was established such that all frequencies involved, i.e., first and second half-pulse frequencies and the pulse repetition frequency (PRF) as well as the pulse-center timing trigger, are derived from the same frequency source (clock) thus providing coherency between signals. Conherency assures that on a pulse-to-pulse basis, the phase relationships of $f_1$ and $f_2$ will remain constant. Variable phase shifter 15 is utilized in the path of the $f_2$ signal to allow the phase thereof to be adjusted such that at the transition time the phase of $f_1$ and $f_2$ is continuous as illustrated in FIG. 2.

What is claimed is:

1. A split pulse generator comprised of a common clock generating a first signal of a first predetermined frequency, means to multiply said first signal to obtain a second signal of a second predetermined frequency, first means to divide said first signal to obtain a third signal of a third predetermined frequency, first means to mix said second signal and said third signal to obtain a fourth signal having a fourth predetermined frequency, second means to divide said third signal to obtain a fifth signal having a fifth predetermined frequency, means to selectively phase shift said fifth signal, second means to mix said fourth signal and the phase shifted signal to obtain a sixth signal having a predetermined frequency, the frequency of said fourth signal differing from the frequency of said sixth signal by a predetermined magnitude, third means to divide said fifth signal by a preselected number to obtain a seventh signal of a preselected pulse repetition frequency, first and second normally closed RF gates receiving said fourth and sixth signals, respectively, first and second gate control pulse generators, each receiving said seventh signal for triggering purposes and in response thereto providing first and second control pulses of predetermined width to said first and second RF gates, respectively, for opening thereof, said first control pulse having a trailing edge substantially coinciding with the leading edge of said second control pulse, means to sum the output signals from said first and second RF gates, means to frequency convert the summed signal to X-band, a third gate control pulse generator also triggered by said seventh signal and providing a pulse therefrom at a predetermined time and at a predetermined width, and operating to provide an output X-band pulse having a first half-pulse frequency and a second half-pulse frequency.

2. A split pulse generator as described in claim 1 further including a first filter interposed between said first mixer means and said first RF gate, and a second filter interposed between said second mixer means and said second RF gate.

* * * * *